United States Patent
Mizuta

[11] Patent Number: 6,087,840
[45] Date of Patent: Jul. 11, 2000

[54] PROBE CARD WITH VERTICAL NEEDLE FOR ENABLING IMPROVED WAFER TESTING AND METHOD OF MANUFACTURING THE SAME

[75] Inventor: Masaharu Mizuta, Hyogo, Japan

[73] Assignee: Mitsubishi Denki Kabushiki Kaisha, Tokyo, Japan

[21] Appl. No.: 09/047,934

[22] Filed: Mar. 26, 1998

[30] Foreign Application Priority Data

Oct. 21, 1997 [JP] Japan ................................. 9-288355

[51] Int. Cl.$^7$ .................................................. G01R 31/02
[52] U.S. Cl. ........................ 324/754; 324/762; 324/761
[58] Field of Search ................................. 324/72.5, 754, 324/755, 761, 762; 439/682, 824

[56] References Cited

U.S. PATENT DOCUMENTS

| | | | |
|---|---|---|---|
| 4,506,215 | 3/1985 | Coughlin | 324/761 |
| 4,554,506 | 11/1985 | Faure et al. | 324/761 |
| 4,901,013 | 2/1990 | Benedetto et al. | 324/761 |
| 5,525,911 | 6/1996 | Marumo et al. | 324/754 |

FOREIGN PATENT DOCUMENTS

| | | |
|---|---|---|
| 57-146340 | 9/1982 | Japan. |
| 63-208237 | 8/1988 | Japan. |

*Primary Examiner*—Vinh P. Nguyen
*Attorney, Agent, or Firm*—McDermott, Will & Emery

[57] ABSTRACT

An improved probe card with a vertical needle is provided which ensures required needle pressure even when there is a significant variation of probe needles in a height direction. Upper and lower portions of probe needle are respectively supported by upper and lower guide plates. Upper portion of probe needle is bent in an L shape. A printed substrate is provided on upper guide plate.

11 Claims, 9 Drawing Sheets

PROBE CARD WITH VERTICAL NEEDLE FOR ENABLING IMPROVED WAFER TESTING AND METHOD OF MANUFACTURING THE SAME

BACKGROUND OF THE INVENTION

1. Field of the Invention

The present invention generally relates to probe cards with vertical needles, and more specifically, to an improved probe card with a vertical needle which enables wafer testing in shorter time and which can be manufactured with reduced cost. The invention also relates to a method of manufacturing such a probe card with a vertical needle. The invention also relates to a test method of a wafer using such a probe card with a vertical needle.

2. Description of the Background Art

Generally, in a process of manufacturing an IC (Integrated Circuit), an LSI (Large Scale Integration) or the like, after a number of wafer chips are manufactured on a single substrate, wafer testing is performed to determine if an individual chip is good or defective before the wafer chips are cut into separate chips. Such wafer testing is generally performed with a probe card connected to an apparatus which is so-called a prober, and with a probe needle of the probe card kept in contact with a prescribed electrode (a pad) of a semiconductor chip. After the probe needle has been brought into contact with the semiconductor chip, a prescribed pressure (hereinafter referred to as a needle pressure) is applied between the probe needle and the pad (the operation is called overdriving). The overdriving allows the probe needle to slide over a pad surface, removing aluminum oxide thereon. Thus, aluminum under the aluminum oxide and the probe needle are electrically connected.

Figure 20:
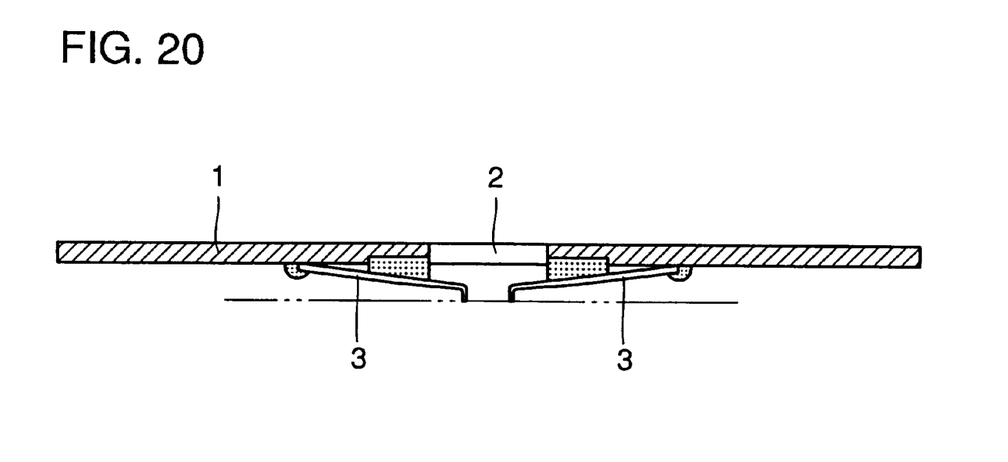
FIG. 20 is a cross sectional view showing a conventional cantilever type probe card.

FIG. 20 is a cross section showing a probe card using a conventional cantilever type probe needle, which is disclosed in Japanese Utility Model Laying-Open No. 57-146340. The probe card includes a single printed board (hereinafter referred to as a substrate) 1. An opening 2 is formed in a middle portion of substrate 1. In a prescribed position in the opening, a plurality of probe needles 3 are radially provided on a lower surface of substrate 1, so that tips thereof are mutually aligned. Roots of probe needles 3 and a contact portion for connecting a connector (not shown), provided at an end of printed board 1 are connected through printed interconnection or wiring.

Figure 21:
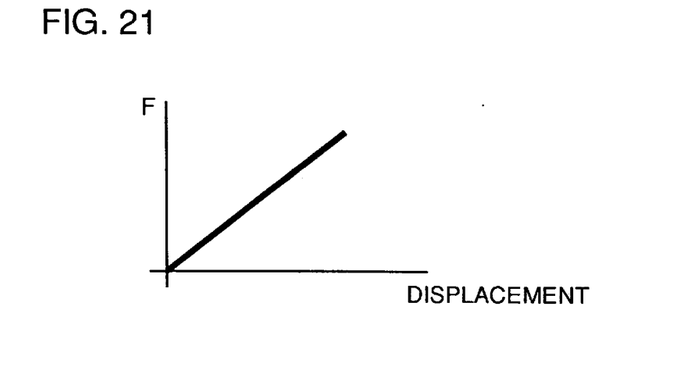
FIG. 21 is a diagram showing a relation between displacement and needle pressure for a vertical needle of the cantilever type probe card.
Figure 22:
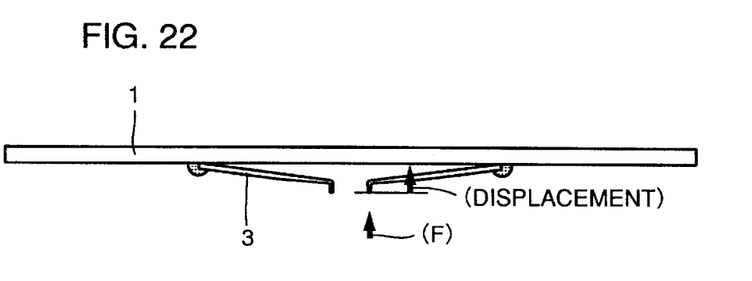
FIG. 22 is a diagram showing directions for needle pressure and displacement of the cantilever type probe card.

FIG. 21 shows a relation between displacement of the cantilever type probe needle and force (F). In the description, the displacement of the probe needle corresponds to a height between the tip of probe needle 3 and a surface of substrate 1, with reference to FIG. 22. On the other hand, force (F) corresponds to needle pressure (F) applied to probe needle 3 in a height direction during overdriving.

Referring to FIG. 21, there is a linear relation between displacement of probe needle and force. Generally, overdriving of about 100 μm applies needle pressure of several grams (for example seven grams) to probe needle 3. Thus, the pad and probe needle 3 are electrically connected for wafer testing.

The relation in position of probe needle 3 and the pad must be carefully considered in directions of length, width and height, each requiring accuracy of about ±10 μm. Still higher accuracy will be strictly required for a high density IC, which will be developed in the future. Presently, the relation in position of the probe needle and the pad is manually adjusted. However, the adjustment of the height of the probe needle (a distance between the tip of the probe needle and the lower surface of the substrate) is difficult.

Further, in testing a memory IC, a testing method called a simultaneous measurement test is generally employed for simultaneously testing a plurality of memory IC chips on a wafer. In most cases, the number of pads to be in contact with the probe needles is 2×8, which equals to sixteen in total during simultaneous measurement test. More specifically, referring to FIG. 20, one column of the cantilever type probe needles makes contact with one column×eight ICs and the other column of another probe needles makes contact with one column×eight ICs, so that 2×8 memory IC chips are subject to simultaneous measurement test in total.

Here, assume that there is a wafer having a certain number of IC chips and an arrangement such that all of IC chips on the wafer are tested by performing 2×8 simultaneous measurement test twenty times. For 4×4 or 4×8 simultaneous measurement test, the number of times that simultaneous measurement test must be performed to complete testing of all IC chips on a single wafer is reduced as follows as compared with the case for 2×8 simultaneous measurement test.

For 2×8 simultaneous measurement test, twenty times per wafer

For 4×4 simultaneous measurement test, fifteen times per wafer (−25%)

For 4×8 simultaneous measurement test, ten times per wafer (−50%)

As in 4×8=32 simultaneous measurement test, the number for testing is reduced as the number of chips for simultaneous measurement test increases. In addition, 4×4 simultaneous measurement test requires the number of times for testing smaller than that for 2×8 simultaneous measurement test, though both of them have the same number of IC chips for simultaneous measurement test. This is explained by an arrangement of the plurality of memory IC chips on a single wafer.

Smaller number of times for testing means that the time required for testing per wafer is shorter. The above mentioned data shows that the time required for testing can be reduced by 25% or 50% simply by changing the arrangement of IC chips on a probe card.

Reduction in the time required for testing means that the time for performing a testing step per se is reduced, resulting in reduction in a delivery time. In addition, production can be increased by 25% or 50% with the same number of testers. Therefore, increase in the number of chips for simultaneous measurement test in the probe card is a significant matter for those concerned with the manufacture of probe cards in a wafer testing section.

Figure 23:
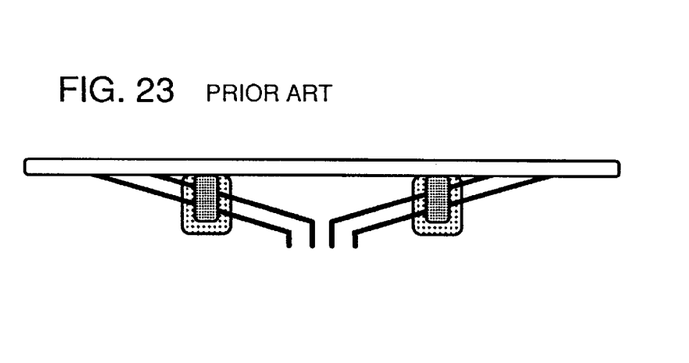
FIG. 23 is a cross sectional view showing a conventional cantilever type probe card with 4×4 arrangement.

The above mentioned 2×8 and 4×4 arrangements, allowing simultaneous measurement test of sixteen chips, do not require any modification to testers. Thus, 4×4 arrangement, which requires smaller amount of time for testing, should have been put into practice by now. However, such three dimensional 4×4 arrangement, where cantilever type probe needles as shown in FIG. 23 are provided in two stages on either side, has not been actually put into practice. The reason is as follows. While the manufacture of such 4×4 arrangement is possible, there is a problem associated with complicated adjustment in position of probe needles and pads in directions of length, width and height, which must be performed every time after testing is completed, as well as troublesome maintenance such as repairing. As a result, cost per needle is increased several times.

The troublesome operation of the adjustment can well be understood, for example, by referring to numerical values showing precision of a probe needle. The structure of the probe needle is as follows.

Diameter of a tip of the probe needle: approximately 30 μmφ

Pitch of the probe needle: approximately 100 μm

The number of probe needles: approximately 300 per column

Positioning accuracy for the probe needle: approximately ±10 μm

For 4×4 simultaneous measurement test, one column includes 300 probe needles. Referring to FIG. 23, take the inner two columns with longer probe needles, for example. In this case, it is considerably difficult to adjust the position of the probe needle in directions of length, width and height such that the positioning accuracy for the tip of the probe needle is always kept at approximately ±10 μm. Thus, actually, a method of performing 2×8 simultaneous measurement test with a probe card having only the outer two columns has been put into practice.

Recently, especially for a DRAM (Dynamic Random Access Memory) ICs, degree of integration is dramatically increasing from 16M to 64M, then to 256M, requiring larger amount of time for testing. This is a bottleneck in the manufacturing line of ICs. Therefore, reduction in time for testing is a significant matter to be achieved.

Practical application of the arrangement of the probe card with 4×4, 4×8 or n (not less than four)×m, which is effective for reducing the amount of time required for testing, is considered in the form of a probe card which employs a probe needle called a vertical needle (hereinafter referred to as a probe card with a vertical needle).

Figure 24:
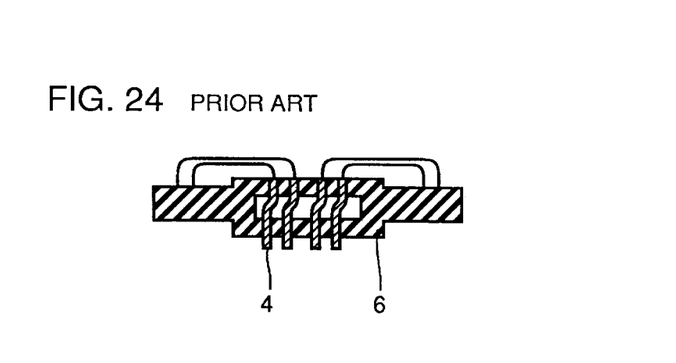
FIG. 24 is a cross sectional view showing a conventional probe card with a vertical needle.

FIG. 24 is a cross section of the conventional probe card with a vertical needle shown in *NIKKEI MICRODEVICES*, September 1996, p. 104. Referring to FIG. 24, a pin 4 is vertically provided through a hole formed in a guide plate 6. The tips of the pins are freely positioned. A wafer is vertically upwardly moved from below to contact with pin 4. When a load is applied to the tip of the pin, pin 4 contracts as it has a function of spring. Further description of the conventional probe card with a vertical needle is not available, so that there still remains a number of unclear points as to its structure and the method of manufacturing the same.

SUMMARY OF THE INVENTION

Therefore, an object of the present invention is to provide a probe card with a vertical needle (a probe needle) which readily allows an arrangement of 4×4, 4×8 or n(not less than four)×m.

Another object of the present invention is to provide an improved probe card with a vertical needle which can be easily manufactured with less cost.

Still another object of the present invention is to provide an improved probe card with a vertical needle which allows reduction in the amount of time for testing.

Still another object of the present invention is to provide an improved probe card with a vertical needle which allows reduction in cost for testing.

Another object of the present invention is to provide a probe card with a vertical needle which enables a user to obtain a less expensive IC.

Still another object of the present invention is to provide a test method of a wafer using a probe card with a vertical needle.

A probe card with a vertical needle according to one aspect of the present invention allows a lower portion of a probe needle to vertically make contact with a pad for an IC, and transmits an electrical signal from the IC to a tester. The probe card with a vertical needle includes the probe needle having upper and lower portions and a middle portion therebetween. The upper portion of the probe needle is bent in an L shape to have vertical and horizontal portions. The probe card with a vertical needle includes an upper guide plate through which the upper portion of the probe needle is passed and which supports the upper portion. A lower guide plate is provided under the upper guide plate through which the lower portion of the probe needle is passed and which supports the lower portion. A printed substrate is provided on the upper guide plate.

In a probe needle according to a second aspect of the present invention, the middle portion of the probe needle is made narrower than the upper and lower portions.

In a probe card with a vertical needle according to a third aspect of the invention, the middle portion of the probe needle is of a rectangular cross section.

In a probe card according to a fourth aspect of the invention, the probe needle is formed of a bent plate like member.

In a probe card with a vertical needle according to a fifth aspect of the invention, the upper guide plate includes a hole through which the upper portion of the probe needle is passed, and a groove which is formed in the surface of the upper guide plate to be continuous to the hole and which secures the horizontal portion of the probe needle fit therein.

In a probe card according to a sixth aspect of the present invention, the upper and lower guide plates are spaced apart by a given distance to expose the middle portion of the probe needle. The upper and lower guide plates are offset in a horizontal direction so that the middle portion of the probe needle is bent.

In a probe card with a vertical needle according to a seventh aspect of the invention, the printed substrate includes a hole vertically passing therethrough. One end of a wire is electrically connected to the horizontal portion of the probe needle, whereas the other end of the wire is connected to a pattern land formed on the printed substrate.

In a probe card with a vertical needle according to an eighth aspect of the invention, a flat cable, a multilayer flat cable, a coaxial cable or multiwire is provided on the printed substrate for transmitting an electrical signal from the IC to a tester through the pattern land.

In a probe card with a vertical needle according to a ninth aspect of the invention, the material of the upper and lower guide plates is the same as that used for the wafer in which IC chips for wafer testing are formed.

In a probe card with a vertical needle according to a tenth aspect of the invention, the upper and lower guide plates are formed of mica type ceramics with high workability.

In a method of manufacturing a probe card with a vertical needle according to an eleventh aspect of the invention, a lower portion of the probe needle is vertically made in contact with a pad for an IC, and an electrical signal from the IC is transmitted to a tester. The probe needle is prepared which has upper and lower portions and a middle portion therebetween, and which is bent in an L shape such that the upper portion includes vertical and horizontal portions. An upper guide plate is prepared having a first through hole through which the probe needle is passed and a groove on its surface in which the horizontal portion of the probe needle fits. A lower guide plate having a second through hole through which the probe needle is passed is also prepared. The upper guide plate is provided on the lower guide plate such that the first and second through holes are vertically aligned. The probe needle is inserted into the first and second through holes until the horizontal portion fits completely in the groove. The upper and lower guide plates are pulled apart to expose the middle portion of the probe needle. The upper and lower guide plates are offset in a horizontal direction, so that the middle portion of the probe needle is bent.

In a test method of a wafer according to a twelfth aspect of the invention, a probe card with a probe needle of which lower portion is vertically brought into contact with a pad of an IC for transmitting an electrical signal from the IC to a tester is prepared which includes the probe needle including an upper portion and said lower portion and a middle portion therebetween, the upper portion being bent in an L shape to have vertical and horizontal portions, an upper guide plate passing the upper portion of the probe needle therethrough for supporting the upper portion, a lower guide plate provided under the upper guide plate and passing the lower portion of said probe needle therethrough for supporting the lower portion, and a printed substrate provided on the upper guide plate. The probe needle is pressed against a surface of a wafer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Referring to the drawings, a probe-card with a vertical needle which readily allows an arrangement of 4×4, 4×8 or n(not less than four)×m and which can easily be manufactured with less cost, and a method of manufacturing the same will now be described.

First Embodiment

Figure 1:
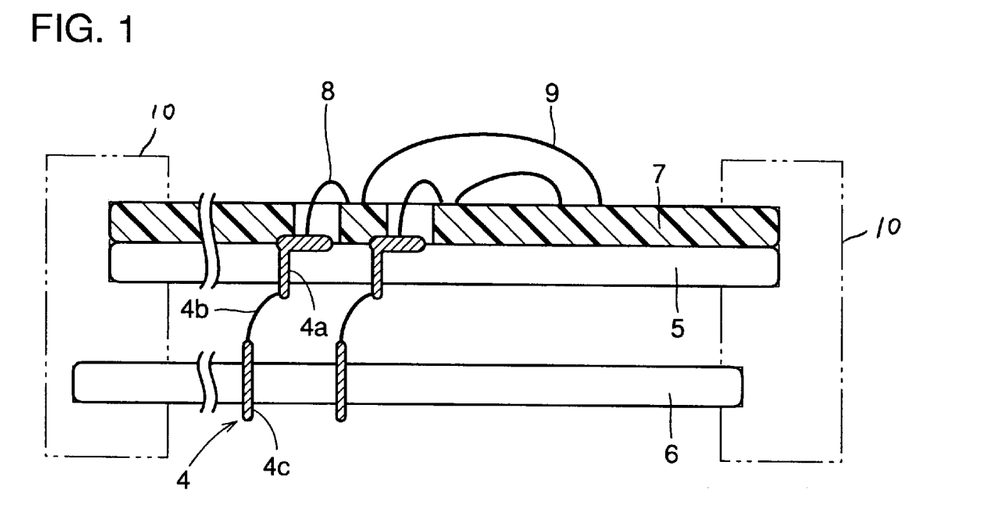
FIG. 1 is a cross sectional view showing a probe card with a vertical needle in accordance with the present invention.

FIG. 1 is a diagram of a probe card with a vertical needle in accordance with a first embodiment, showing a cross section of a portion near probe needles in third and fourth columns in a right half of 4×4 arrangement.

Referring to FIG. 1, a probe needle 4 includes upper and lower portions 4a and 4c and a middle portion 4b therebetween. Upper portion 4a of probe needle 4 passes through an upper guide plate 5. As will be later described, upper guide late 5 prevents rotation of probe needle 4 and serves to fix probe needle 4. The lower portion of probe needle 4 passes through a lower guide plate 6. To keep a tip of probe needle 4 in contact with a pad, lower guide plate 6 serves to position probe needle 4. These two different upper and lower guide plates 5 and 6 are both formed of the same silicon compound as that used for a wafer of IC chips. They are formed, for example, of silicon nitride $Si_3N_4$ or mica type ceramics which facilitates formation of fine holes.

A printed substrate 7 is provided on upper guide plate 5. Printed substrate 7 has holes or grooves for passing a plurality of bonding wires 8. As will be later described, printed substrate 7 has a similar function as that used for a conventional probe card. Probe needle 4 and a pattern formed on printed substrate 7 are electrically connected through bonding wire 8. A flat cable or coaxial cable 9 is provided on printed substrate 7.

As will be later described, flat cable or coaxial cable 9 has its one end connected to the pattern formed on printed substrate 7 and the other end connected to another pattern formed on a larger space, both by soldering. Flat cable or coaxial cable 9 serves to transmit a signal. Printed substrate 7 and upper and lower guide plates 5 and 6 are firmly fixed by a support member 10.

Probe needle 4 is forced against a pad for an IC on a wafer. An electrical signal from the tip of the probe needle in contact with the pad would be transmitted to a tester through a body of probe needle 4, bonding wire 8 and flat cable 9 for wafer testing.

According to the probe card with a vertical needle of the present embodiment, probe needles can be arranged in a grating to achieve high density and nxm arrangement is readily obtained since the probe needle is as small as a usual vertical needle. Further, accurate alignment at any temperature can be achieved as lower guide plate 6 for positioning probe needle 4 is formed of the same silicon compound as that used for the wafer of IC chips.

Functions of elements forming the probe card with a vertical needle according to the present embodiment and the operation thereof will further be described in detail with reference to the drawings.

Figure 2A:
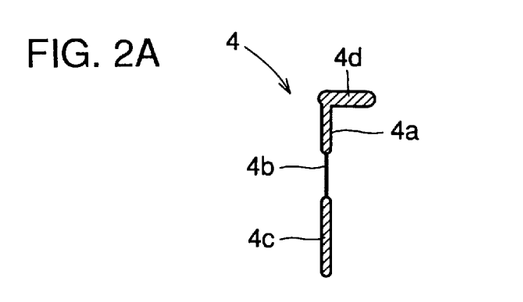
FIGS. 2A and 2B are diagrams showing in detail probe needles used in a probe card with a vertical needle in accordance with the present invention.

FIGS. 2A and 2B are diagrams related to the vertical needle in the probe card according to the present embodiment. Referring to FIG. 2A, probe needle 4 includes upper and lower portions 4a and 4c and middle portion 4b therebetween. Upper portion 4a of probe needle 4 is bent almost at 90° and has a horizontal stopper portion 4d which facilitates wire bonding. Middle portion 4b has a prescribed length and made, to some extent, narrower than upper and lower portions 4a and 4c.

Figure 2B:
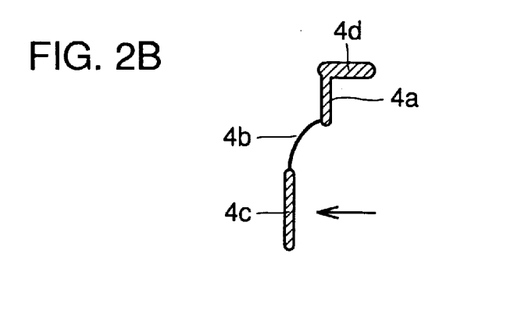
Figure 3:
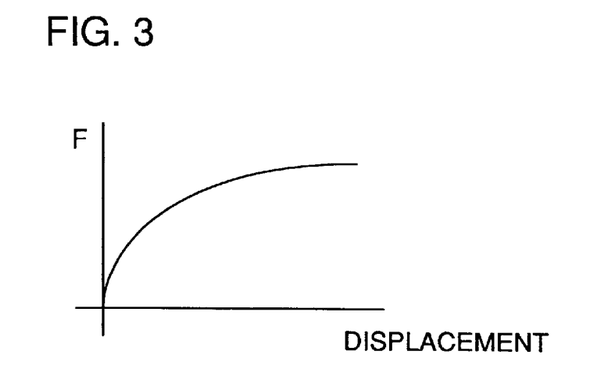
FIG. 3 is a diagram showing a relation between needle pressure and displacement for the probe card with a vertical needle in accordance with the present invention.

Referring to FIG. 2B, when force is laterally applied to lower portion 4c of probe needle 4, middle portion 4b is bent as shown in the drawing. The relation between the force applied to probe needle 4 from immediately below, that is, needle pressure (F) when probe needle 4 is in contact with the pad, and a distance over which the probe needle is vertically moved (displacement) is shown in a saturation curve in FIG. 3. Thus, the spring characteristics of the probe needle is preferably determined to obtain required needle pressure by suitably reducing the distance between the probe card and the pad, while considering the characteristics shown in FIG. 3.

Preferably, beryllium copper or the like is selected as the material for the probe needle. The probe needle is gradually tapered from its upper portion (having diameter of approximately 80 $\mu m\phi$) toward its lower portion (having diameter of approximately 30 $\mu m\phi$) to form a tip, for example by electropolishing or nitric acid etching.

The cross section of middle portion 4b, which has been made smaller than other portions, may be of a round or rectangular shape. However, the rectangular shape is preferred so that the probe needle can be bent in a given direction to prevent contact with the adjacent probe needle.

The tip of the probe needle is preferably metal plated to obtain high conductivity, wear-resistance and non-cohesiveness or the like. In addition, middle portion 4b is Teflon (trademark) coated to provide the needle with insulation properties. Stopper portion 4d is suitably coated for wire bonding.

Figure 4:
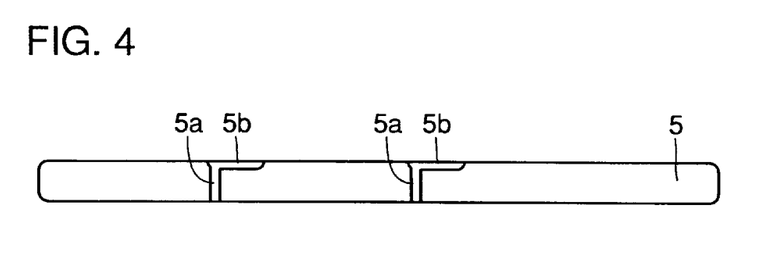
FIG. 4 is a cross sectional view showing an upper guide plate used in the probe card with a vertical needle in accordance with the present invention.
Figure 5:
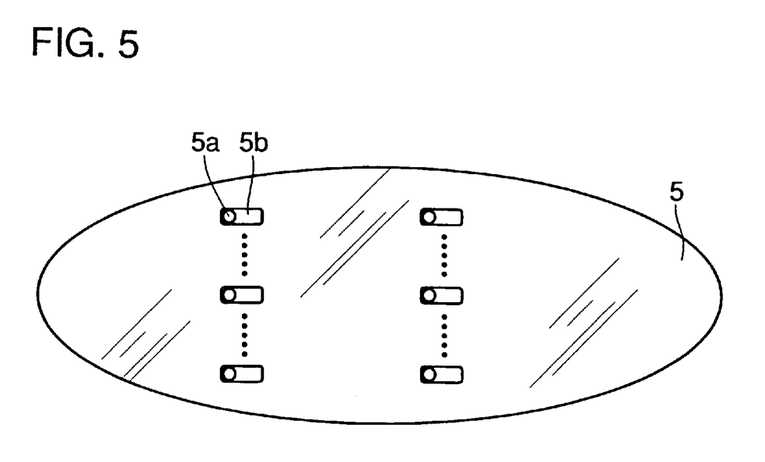
FIG. 5 is a diagram showing the upper guide plate.

FIG. 4 is a cross sectional view showing the upper guide plate used for the probe card with a vertical needle in accordance with the present invention. FIG. 5 is a diagram showing the upper guide plate. While the upper guide plate is shown in FIG. 5 in the shape of an ellipse for the convenience of the drawing, it actually has a round shape. Upper guide plate 5 has a hole 5a (having diameter of approximately 90 $\mu m\phi$) through which the probe needle passes. A groove 5b is formed in the surface of upper guide plate S which is continuous to hole 5a and in which about half of stopper portion 4d of the probe needle fits. Groove 5b is formed by precision processing for positioning the probe needle so that rotation of the probe needle is prevented and suitable wire bonding is obtained for the stopper portion. Upper guide plate 5 is formed of silicon compound. The number of holes 5a or grooves 5b is identical to the number of pads or probe needles. Hole 5a and groove 5b are generally formed by ultrasonic processing.

Figure 6:
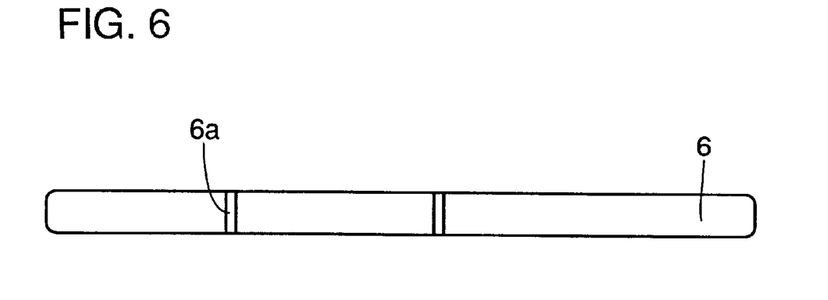
FIG. 6 is a cross sectional view showing a lower guide plate used in the probe card with a vertical needle in accordance with the present invention.
Figure 7:
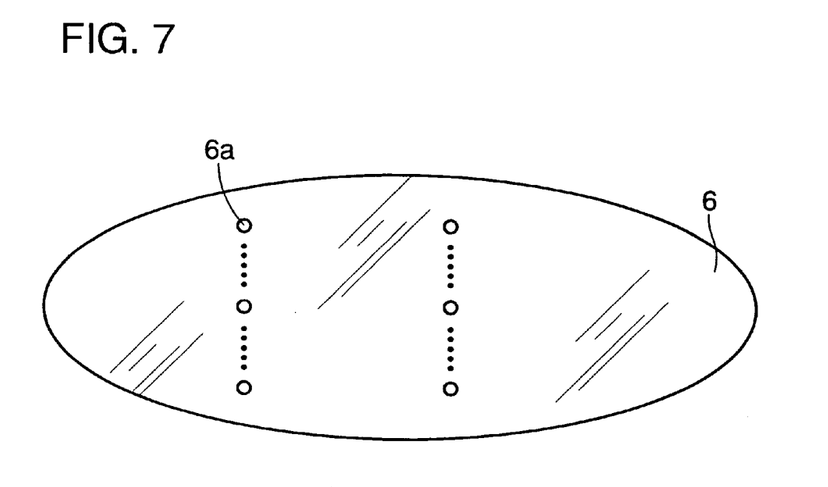
FIG. 7 is a diagram showing the lower guide plate.

FIG. 6 is a cross sectional view showing the lower guide plate and FIG. 7 is a top view thereof. Here, while the lower guide plate is also shown in an ellipse, it actually has a round shape. Referring to the drawings, a hole (having diameter of approximately of 40 $\mu m\phi$) 6a through which the probe needle passes is formed in a lower guide plate 6. Lower guide plate 6 is formed of silicon compound. The number of holes 6a is identical to the number of pads or probe needles. Hole 6a is generally formed by ultrasonic processing.

Second Embodiment

Now, a method of manufacturing the probe card with a vertical needle in accordance with the first embodiment will be described.

Figure 8:
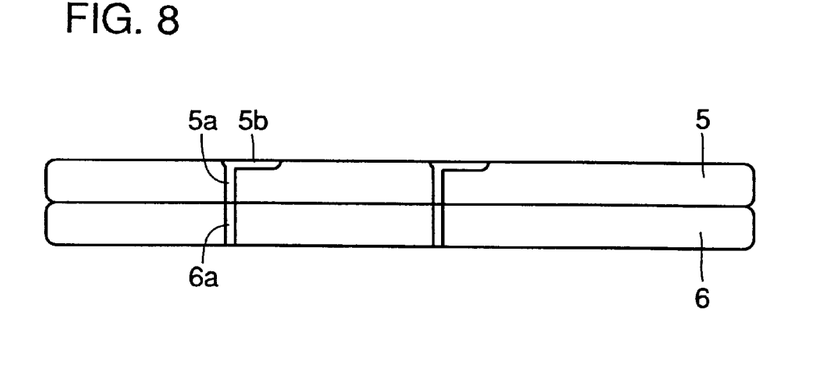
FIGS. 8 to 11 are diagrams showing first to fourth steps in order of a method of manufacturing a probe card with a vertical needle in accordance with the present invention.

Referring to FIG. 8, upper and lower guide plates 5 and 6 are placed on each other with holes 5a and 6a aligned. Upper and lower guide plates 5 and 6 are both formed of the same silicon compound as that for the wafer of IC chips, so that alignment in center is accomplished for every hole at any temperature.

Figure 9:
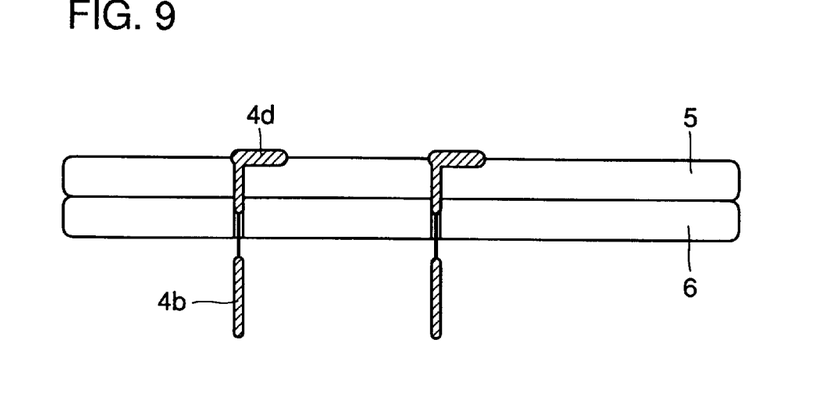

Referring to FIGS. 8 and 9, a probe needle 4 is inserted into holes 5a and 6a until a horizontal stopper portion 4d fits in a groove 5b formed in the surface of upper guide plate 5. Upper and lower guide plates 5 and 6 are formed of the same silicon compound as that used for the wafer of IC chips, so that alignment in center for holes is accurately accomplished at any temperature. Thus, though hole 5a is spaced apart from the adjacent hole by as small a distance as about 100 $\mu m$, probe needle 4 is inserted without fail into the corresponding hole, allowing rapid inserting operation. While the probe needle may also be inserted manually, the operation is preferably performed by a robot for mass production.

Figure 10:
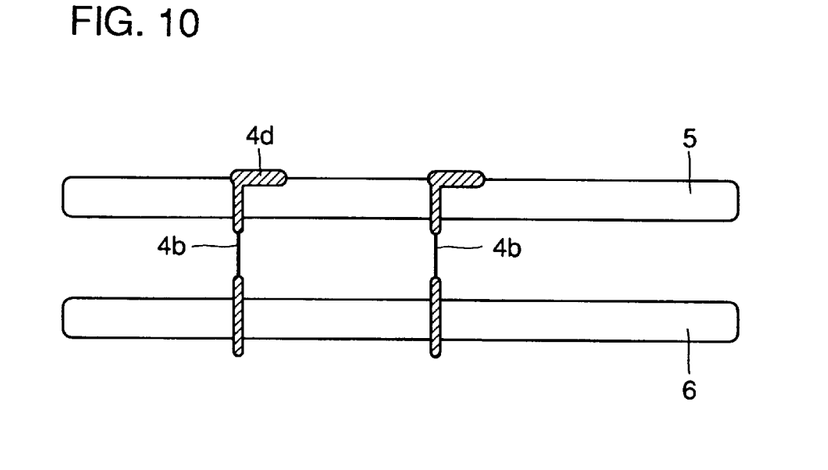

Referring to FIG. 10, upper and lower guide plates 5 and 6 are pulled apart in parallel, so that middle portion 4b of probe needle 4 is exposed.

Figure 11:
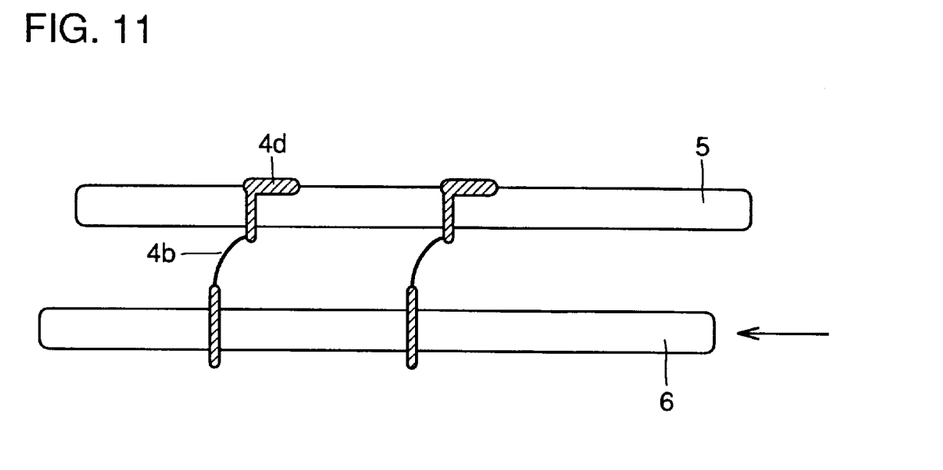

Referring to FIG. 11, lower guide plate 6 is offset with respect to upper guide plate 5 in a direction opposite from that in which stopper portion 4d of the probe needle extends, so that middle portion 4b of probe needle 4 is bent. Middle portion 4b of probe needle 4 thus bent gives rise to the characteristics shown in FIG. 3, whereby required needle pressure can be obtained for a probe card even when there is a significant variation in probe needles 4 in a direction of height. Such series of operations can easily be accomplished with a high precision assembling apparatus. Thereafter, a printed substrate is provided on the upper guide plate, and the printed substrate and upper and lower guide plates are firmly fixed by a support member, though not shown in the drawings.

Figure 12:
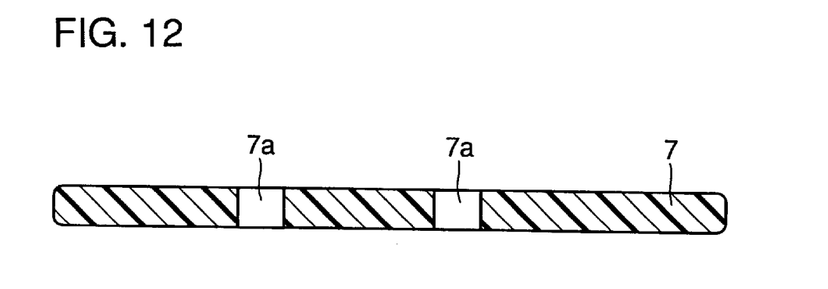
FIG. 12 is a cross sectional view showing a printed substrate used in a probe card with a vertical needle in accordance with the present invention.
Figure 13:
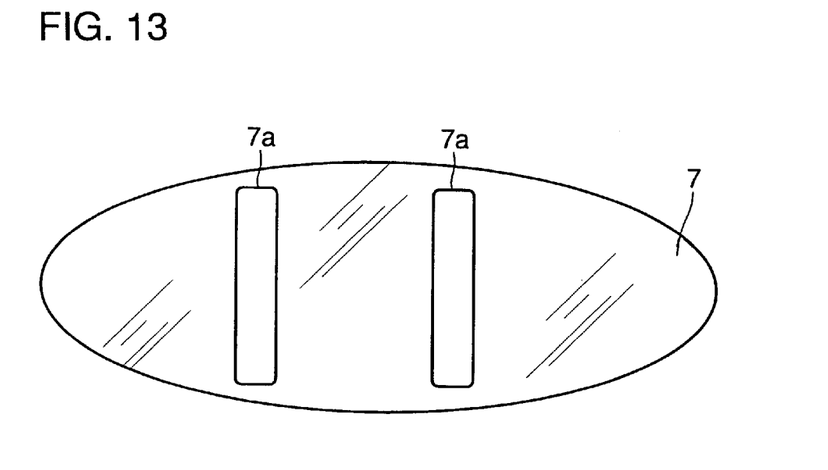
FIG. 13 is a diagram showing the printed substrate.

FIG. 12 is a cross sectional view showing the printed substrate used in the probe card with a vertical needle in accordance with a second embodiment. FIG. 13 is a plan view of the printed substrate. While the printed substrate is shown in an ellipse in FIG. 13 for the convenience of the drawings, it actually has a round shape.

Referring to FIGS. 12 and 13, in a printed substrate 7, a hole 7a is formed vertically passing therethrough. Hole 7a is formed offset from a column of pads to some extent.

Figure 14:
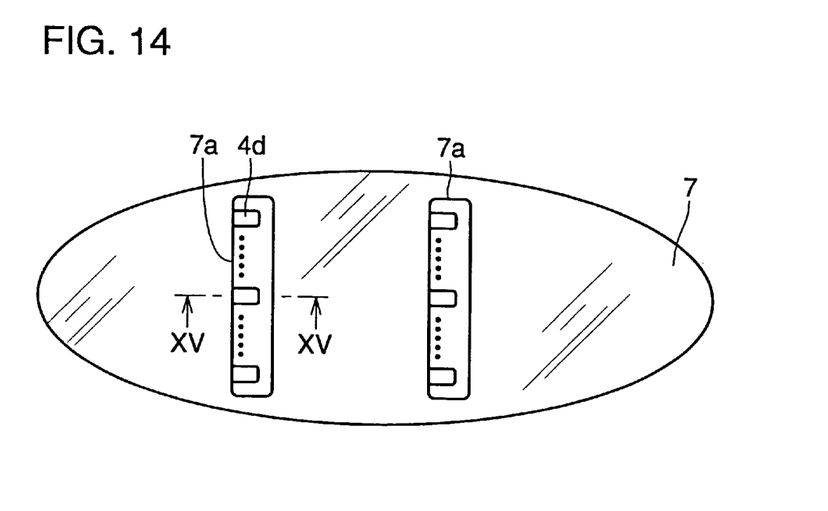
FIG. 14 is a diagram showing the printed substrate placed on the upper guide plate.
Figure 15:
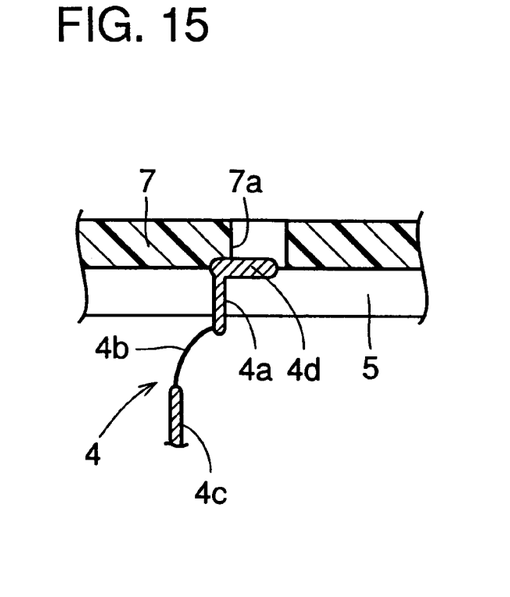
FIG. 15 is a cross sectional view taken along the line XV—XV in FIG. 14.

FIG. 14 shows printed substrate 7 placed on the upper guide plate. FIG. 15 is a cross sectional view taken along the line XV—XV in FIG. 14. Referring to the drawings, printed substrate 7 is placed on upper guide plate 5 such that stopper portion 4d of probe needle 4 is exposed through hole 7a. Printed substrate 7 is provided on upper guide plate 5 to press against the portion immediately above the axis of probe needle 4.

Figure 16:
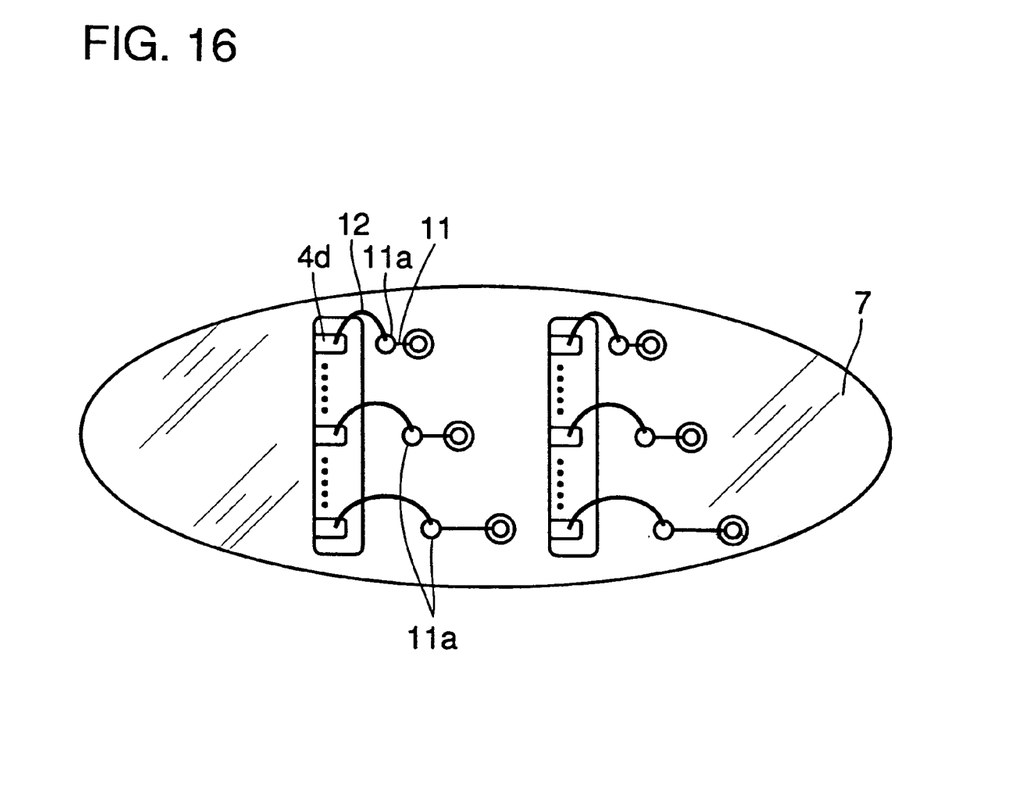
FIG. 16 is a diagram showing a pattern formed on the printed substrate.

Referring to FIG. 16, patterns 11 having lands on opposing sides are formed on printed substrate 7. The number of patterns 11 is identical to that of probe needles 4. One land 11a of pattern 11 and stopper portion 4d of the probe card are connected through wire 10.

Figure 17:
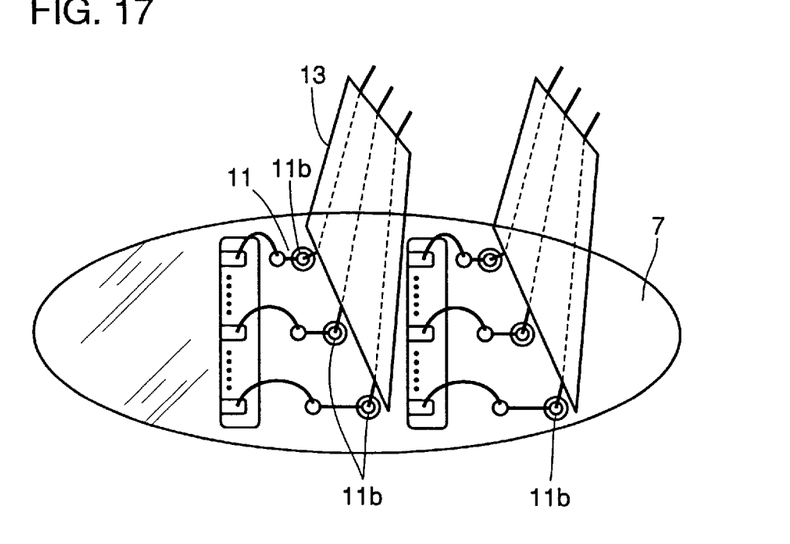
FIG. 17 is a perspective view showing a flat cable provided on the printed substrate.

Referring to FIG. 17, a flat cable 13 or the like is soldered to the other land 11b (which is in most cases connected to a through hole) of pattern 11.

Figure 18:
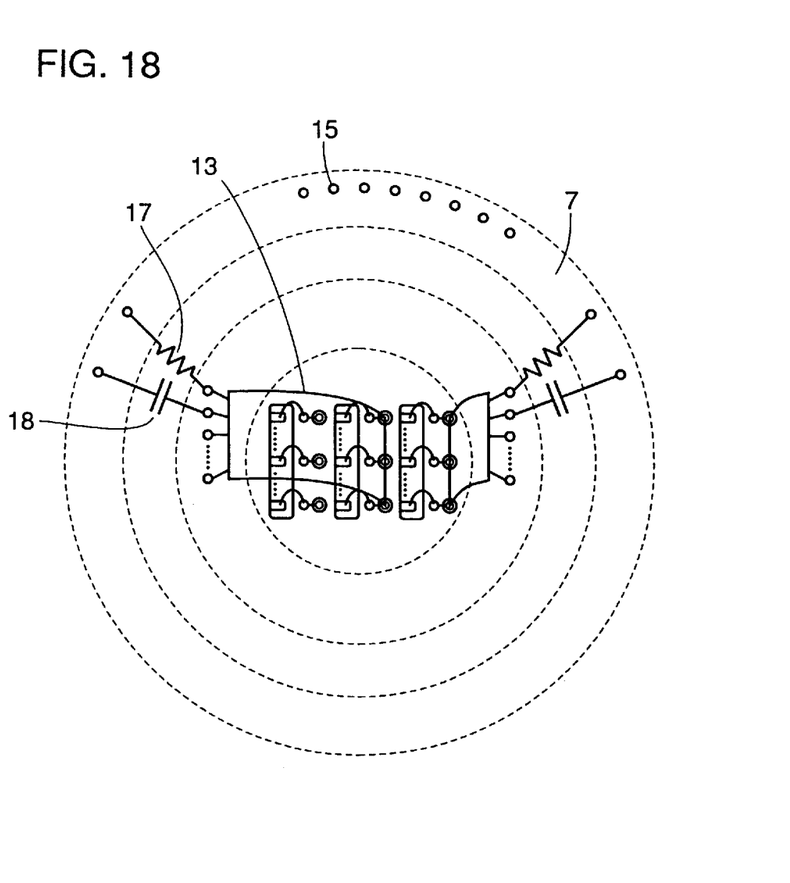
FIG. 18 is a diagram showing in detail a top structure of the printed substrate.

Referring to FIG. 18, the other end of flat cable 13 is connected to a capacitor 18, a resistance 17, a relay or the like. On printed substrate 7, a number of elements for forming wave shapes, such as capacitor 18, resistance 17 or the relay, as well as a pogo pin 15 for connection to a tester, are provided.

Referring to FIG. 17, it is noted that a large space is ensured between lands 11b on the right side in the figure of adjacent patterns 11, lands 11b are offset as shown in the drawing, and further the lengths of patterns 11 are made different from each other to facilitate operations. Longer and shorter patterns 11 are alternately arranged in a column, so that the patterns somehow look like saw teeth when seen from immediately above.

Figure 19:
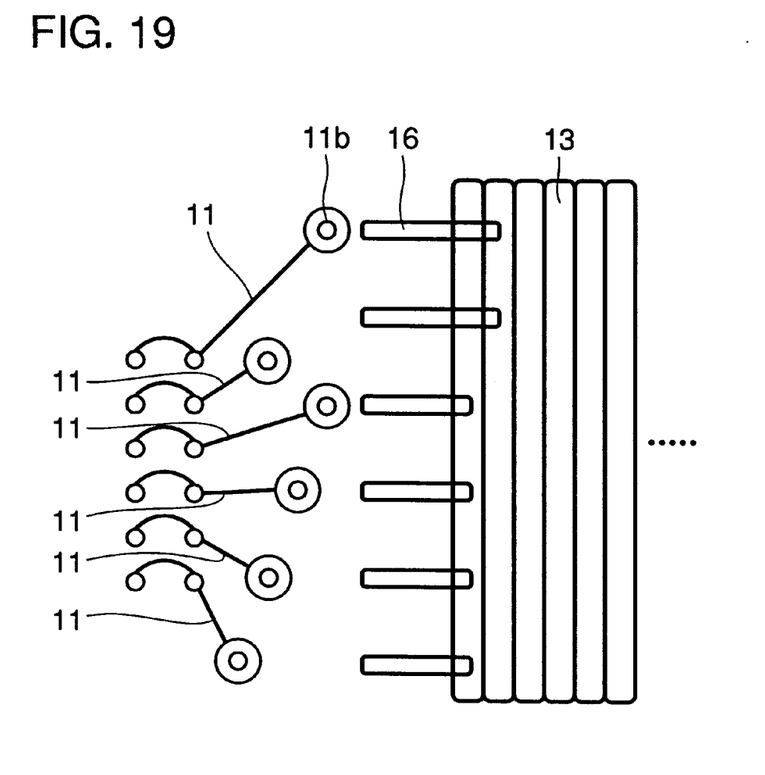
FIG. 19 is a view showing flat cables in a multilayered structure.

For n×m arrangement, as the number of pads included in one column (m) is generally about 100, flat cable 13 has in most cases a multilayered structure as shown in FIG. 19. FIG. 19 is a diagram showing flat cables 13 when seen from above. For n×m arrangement, flat cable 13 is provided in each space between columns, with reference to FIG. 17. Referring again to FIG. 19, m terminals 16 (which may be lead legs) for the flat cable are connected to the other lands 11b of pattern 11. The probe card with a vertical needle according to the present invention is thus completed.

In the present embodiment, lower guide plate 6 was describe as being moved in a direction opposite to that in which stopper portion 4d extends, with reference to FIG. 11. However, the present invention is not limited to this and lower guide plate 6 may be moved in the same direction in which stopper portion 4d extends, or in any other direction.

In addition, in the above described embodiment, the cross section of the middle portion of the probe needle was described as being rectangular. The present invention is, however, not limited to this and the probe needle per se may be formed of a plate such that it cannot be bent in any direction other than a given direction.

Further, while bonding wire 9 was described as being exposed with reference to FIG. 1, resin mold is preferably formed on printed substrate 7 so as to prevent contact of adjacent wires and corrosion of wires.

As in the foregoing, according to the probe card with a vertical needle in conjunction with the first aspect of the present invention, the upper portion of the probe needle is bent in an L shape to have vertical and horizontal portions, so that the vertical needle can be firmly fixed. As a result, wafer testing is effectively performed with high reliability.

According to the probe card with a vertical needle in conjunction with the second aspect of the invention, the middle portion of the probe needle is made narrower than the upper and lower portions, so that the middle portion can be effectively and readily bent.

According to the probe card with a vertical needle in conjunction with the third aspect of the invention, the cross section of the middle portion of the probe needle is bent in a given direction, so that contact of the probe needle with the adjacent probe needle is prevented.

According to the probe card with a vertical needle in conjunction with the fourth aspect of the invention, the probe needle is formed of a bent plate, so that the probe needle can be bent in the given direction. Contact of the probe needle with the adjacent probe needle is thereby prevented.

The probe card with a vertical needle in conjunction with the fifth aspect of the invention, a groove is formed in the upper guide plate for receiving and fixing the horizontal portion of the probe needle, so that the probe needle can be effectively and firmly fixed.

According to the probe card with a vertical needle in conjunction with the sixth aspect of the invention, the middle portion of the probe needle is bent, so that required needle pressure can be effectively obtained even when there is a significant variation in height of the probe needles.

According to a probe card with a vertical needle in conjunction with the seventh aspect of the invention, the wire has its one end electrically connected to the horizontal portion of the probe needle and the other end connected to a pattern land formed on the printed substrate. Thus, the electrical signal received by the probe needle can be effectively transmitted to a tester through the wire.

According to a probe card with a vertical needle in conjunction with the eighth aspect of the invention, the electrical signal from the IC is transmitted through the flat cable or the like, so that a number of interconnections can be effectively incorporated.

According to a probe card with a vertical needle in conjunction with the ninth aspect of the invention, the upper and lower guide plates are formed of the same material as that used for the wafer in which IC chips for wafer testing are formed. Thus, the probe needle can be effectively aligned with and inserted into the hole with high accuracy at any temperature.

According to a probe card with a vertical needle in conjunction with the tenth aspect of the invention, the upper and lower guide plates are formed of mica type ceramics with high workability. Thus, the probe needle can be aligned with the center of the hole at any temperature.

According to the method of manufacturing the probe card with a vertical needle in conjunction with the eleventh aspect of the invention, the upper and lower guide plates are offset in a horizontal direction to bend the middle portion of the probe needle. Thus, the probe card with a vertical needle is effectively provided to which required needle pressure is applied even when there is a significant variation in height of the probe needles.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A probe card with a probe needle of which lower portion is vertically brought into contact with a pad of an IC for transmitting an electrical signal from the IC to a tester, comprising:

the probe needle including an upper portion and said lower portion and a middle portion therebetween, said upper portion being bent in an L shape to have vertical and horizontal portions;

an upper guide plate passing said upper portion of said probe needle therethrough for supporting said upper portion;

said upper guide plate including a hole for passing the upper portion of said probe needle therethrough, and a groove formed on a surface thereof for receiving the horizontal portion of said probe needle, said groove being formed continuously with said hole a lower guide plate provided under said upper guide plate and passing said lower portion of said probe needle therethrough for supporting said lower portion; and a printed substrate provided on said upper guide plate.

2. The probe card with a probe needle according to claim 1, wherein said middle portion of said probe needle is made narrower than said upper and lower portions.

3. The probe card with a probe needle according to claim 1, wherein said middle portion of said probe needle has a rectangular cross section.

4. The probe card with a probe needle according to claim 1, wherein said probe needle is a bent plate like member.

5. The probe card with a probe needle according to claim 1, wherein said upper and lower guide plates are spaced apart by a given distance to expose said middle portion of said probe needle, and said upper and lower guide plates are offset in a horizontal direction so that said middle portion of said probe needle is bent.

6. The probe card with a probe needle according to claim 1, wherein said printed substrate has a hole vertically passing therethrough, a wire being electrically connected at one end to said horizontal portion of said probe needle through said hole and connected at the other end to a pattern land formed on said printed substrate.

7. The probe card with a probe needle according to claim 6, wherein a flat cable, a multilayered flat cable, a coaxial cable or a multiwire is provided on said printed substrate for transmitting the electrical signal from said IC to the tester through said pattern land.

8. The probe card with a probe needle according to claim 1, wherein said upper and lower guide plates are formed of a same material as that used for a wafer with IC chips for wafer testing.

9. The probe card with a probe needle according to claim 1, wherein said upper and lower guide plates are formed of mica type ceramics with high workability.

10. A method of manufacturing a probe card with a probe needle of which lower portion is vertically brought into contact with a pad for an IC for transmitting an electrical signal from the IC to a tester, comprising the steps of:

providing the probe needle having an upper portion and said lower portion and a middle portion therebetween, the upper portion of the probe needle being bent in an L shape to have vertical and horizontal portions;

providing an upper guide plate having a first through hole for passing said probe needle therethrough and a groove on its surface for receiving said horizontal portion of said probe needle;

providing a lower guide plate having a second through hole for passing said probe needle therethrough;

placing said upper guide plate on said lower guide plate such that said first and second through holes are vertically aligned;

inserting said probe needle into said first and second through holes until said horizontal portion fits in said groove;

pulling apart said upper and lower guide plates such that said middle portion of said probe needle is exposed; and offsetting said upper and lower guide plates in a horizontal direction, so that said middle portion of said probe needle is bent.

11. A test method of a wafer, comprising the steps of:

preparing a probe card with a probe needle of which lower portion is vertically brought into contact with a pad of an IC for transmitting an electrical signal from the IC to a tester which includes the probe needle including an upper portion and said lower portion and a middle portion therebetween, said upper portion being bent in an L shape to have vertical and horizontal portions, an upper guide plate having a through-hole for passing said upper portion of said probe needle therethrough and a groove on its surface for supporting said upper portion, a lower guide plate provided under said upper guide plate and passing said lower portion of said probe needle therethrough for supporting said lower portion, and a printed substrate provided on said upper guide plate; and pressing said probe needle against said pad of said IC.

* * * * *